(12) United States Patent
Pillonnet

(10) Patent No.: US 7,368,986 B2
(45) Date of Patent: May 6, 2008

(54) POWER AMPLIFIER WITH LOW POWER DISTORTION AT OUTPUT

(75) Inventor: Gaël Pillonnet, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 106 days.

(21) Appl. No.: 11/321,795

(22) Filed: Dec. 29, 2005

(65) Prior Publication Data

US 2007/0152748 A1 Jul. 5, 2007

(51) Int. Cl.
*H03F 3/38* (2006.01)
(52) U.S. Cl. .................. 330/10; 330/251
(58) Field of Classification Search .......... 330/10, 330/207 A, 251
See application file for complete search history.

(56) References Cited

U.S. PATENT DOCUMENTS

| | | | |
|---|---|---|---|
| 6,351,184 B1* | 2/2002 | Miao et al. | 330/207 A |
| 6,628,166 B2* | 9/2003 | Delano | 330/251 |
| 7,205,834 B2* | 4/2007 | Goto | 330/10 |

* cited by examiner

*Primary Examiner*—Henry Choe
(74) *Attorney, Agent, or Firm*—Lisa K. Jorgenson; Allen, Dyer, Doppelt, Milbrath & Gilchrist, P.A.

(57) ABSTRACT

A digital/analog amplifier includes the following coupled in series: a pulse-width modulator, a control circuit, a power inverter and a filter. The power inverter comprises two transistors series-connected between a power supply terminal and a ground of the amplifier. The control circuit drives the transistors of the power inverter. One output of the filter forms an output of the amplifier to which a load is connected. The amplifier also comprises a capacitive circuit parallel-connected to the output of the power inverter.

16 Claims, 1 Drawing Sheet

POWER AMPLIFIER WITH LOW POWER DISTORTION AT OUTPUT

FIELD OF THE INVENTION

The present invention relates generally to power amplifiers, and more specifically, to a digital/analog amplifier.

BACKGROUND OF THE INVENTION

A digital/analog amplifier of this kind, for example, is commonly used as a D-class amplifier for audio applications, especially embedded applications. This is due to the fact that they have very high rates of efficiency.

The signal to be amplified is pulse-width modulated. The control circuit produces drive signals for the transistors of the inverter as a function of the modulated signal. The output of the inverter is applied to the input of the filter, and a sine signal is recovered at the output of the filter. The output of the amplifier, formed by the output of the filter, is connected to the terminals of a load that is a resistor formed by the impedance of an audio loudspeaker, for example.

Preferably, to obtain optimum efficiency, a differential amplifier is provided. This differential amplifier comprises two arms like the one described above. The output of each arm is connected to a terminal of the load.

To prevent short-circuiting of the power supply of the amplifier, the transistors of the power inverter should not be on simultaneously. For this reason, a lag is introduced between the power-off command for one of the transistors of the inverter and the power-on command for the other transistor. This lag is commonly called a dead time.

While this lag has the advantage of preventing short-circuiting of the power supply, it has the drawback of introducing a distortion into the output signal at the terminals of the load of the amplifier in the form of odd-parity harmonics. The distortion increases with the dead time and with the frequency of the switch-over of the transistors of the power inverters of the amplifier. Reducing the dead time reduces the distortion that it causes at the output of the amplifier. However, the dead time cannot be eliminated, and the distortion that it introduces cannot be eliminated either.

This phenomenon of distortion has been studied, for example, in the documents titled "Compensating For Dead Time Degradation Of PWM Inverter Waveforms", R.C. Dodson et al., IEEE Proceedings B, Vol. 137, Issue 2, March 1990, and "The Analysis And Compensation Of Dead-Time Effects In PWM Inverters", Seung-Gi Jeong et al., Industrial Electronics, IEEE Transactions, Vol. 38, Issue 2, April 1991, pages 108-114. To reduce the distortion due to the dead time, the above two documents introduce a delay in the input signal in the control part of the power amplifier. However, this approach is difficult to implement because it is difficult to apply a delay equal to the dead time, especially when the dead time is small.

It has also been proposed to insert a negative feedback loop into the modulated signal to re-inject a corrective signal as a function of the distortion detected at the output. This approach is very efficient but providing a negative feedback loop is difficult and costly.

SUMMARY OF THE INVENTION

In view of the foregoing background, an object of the present invention is to provide an approach to the problem described above that is easier to implement.

To achieve this object, the circuit of the invention, which complies with the generic definition given to it in the above introduction, further comprises a capacitive circuit that is parallel-connected with the output of the power inverter.

A parasitic capacitive circuit, which is inherent in the power inverter and which it is commonly sought to avoid, has a surprisingly beneficial effect on the distortion caused by the dead time in the output signal of the amplifier. It is useful to increase the capacitance of the parasitic capacitive circuit to augment this beneficial effect, and thus eliminate the distortion caused by the dead time.

To increase the capacitance of the parasitic capacitive circuit, an output capacitive circuit is added in parallel to the output of the inverter, and hence the capacitance is added to the capacitance of the parasitic capacitive circuit.

Study of the output signals of the amplifier has shown that a capacitive circuit Cout at the output of the amplifier generates a square-wave signal that is expressed in frequency by a sine signal with added odd-parity harmonics (this can be seen by a Fourier series decomposition), and that these odd-parity harmonics counter the harmonics introduced by the dead time and attenuate them, or even make them disappear so that the distortion of the output signal disappears.

BRIEF DESCRIPTION OF THE DRAWINGS

The invention will be understood more clearly and other features and advantages shall appear from the following description of an exemplary mode of implementation of an amplifier according to the invention. The description, given by way of an indication that in no way restricts the scope of the invention, must be read with reference to the appended drawing wherein the single figure is a schematic diagram of an amplifier according to the invention.

DETAILED DESCRIPTION OF THE PREFERRED EMBODIMENTS

Figure 1:
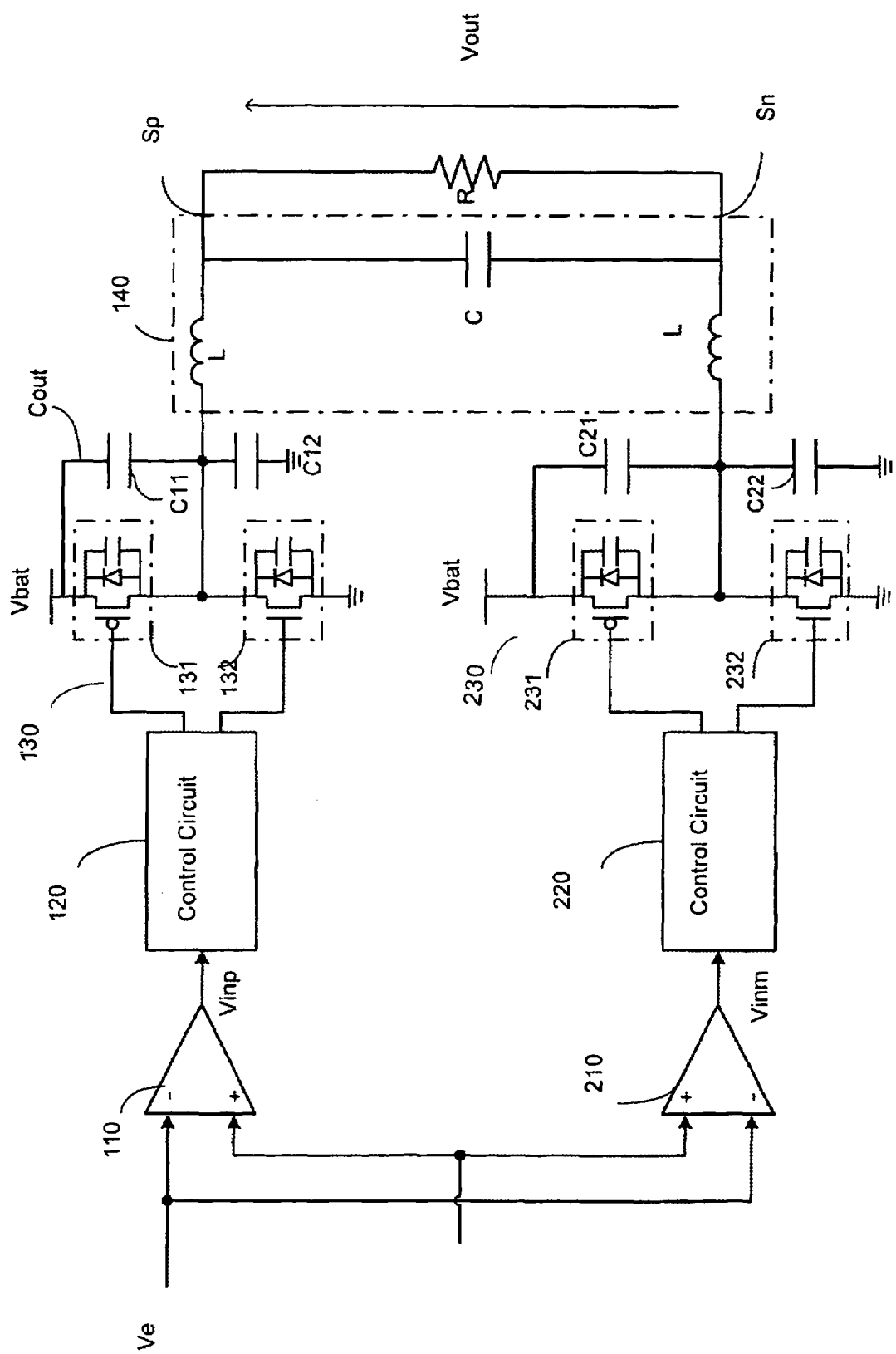

A digital/analog amplifier typically comprises an arm in which the following are associated in series: a pulse-width modulator PWM 110, a control circuit 120, a power inverter 130 and a filter 140. The filter 140 in this case is an LC type filter. The inverter 130 has a P-type power transistor 131 and an N-type power transistor 132 series-connected between a power supply terminal to which a power supply potential Vbat is applied and a ground of the amplifier.

In the example shown in FIG. 1, the amplifier is a differential amplifier and comprises two arms as described above, one called PLUS and the other called MINUS. If the amplifier is a D-class amplifier, a differential assembly gives an output power equal to four times the power of a non-differential amplifier. Thus, amplifiers capable of achieving efficiency levels of about 90% are obtained.

In one exemplary application, the amplifier is used to amplify audio type signals Ve with a frequency ranging from 0 to 24 KHz. In the example shown, the modulators include a comparator 110, 210, to compare the input signal Ve with a ramp signal, and produce modulated signals Vinp, Vinm as a function of the result of the comparison. The modulated signals are square-wave signals whose width varies as a function of the time during which the signal Ve is greater (or smaller) than the ramp-shaped reference signal. This is the known principle of pulse-width modulation.

The modulated signals are applied to the input of the control circuits 120, 220, each of which produces a pair of control signals appropriate to driving the transistors of the power inverters 130, 230. For each inverter (130 or 230 as the case may be), each pair of signals is suited to powering off one transistor at each leading or trailing edge of the modulated signal (Vinp or Vinm) and then powering on the other, different type of transistor after a time tnr has elapsed.

The lag tnr between the powering-off of one transistor and the powering-on of the other transistor is the dead time introduced by the control circuit. Naturally, it will be sought to minimize or reduce the dead time as much as possible, as a function of the transistors chosen to make the power inverters.

The transistors 131, 132 are driven by the pair of signals produced by the control circuit 120 and the transistors 231, 232 are driven by the pair of signals produced by the control circuit 220. The output signals from the inverters are an amplified image of the input signal Ve. Each transistor 131, 132, 231, 232 has a parasitic diode Dh and a parasitic capacitor Cp, inherent to the transistor and appearing in parallel on the channel of the transistor.

Connected at the output of the inverters 130, 230, the output filter 140 enables a sine signal Vout to be recovered at the output of the filter. The output of the filter 140 forms the output of the amplifier, represented in the example between the terminals Sp and Sm. In the example, the filter 140 is an LC type resonant filter, whose parameters L and C are chosen so that the resonance is as close as possible to the range of frequencies of the signal Ve so that, naturally, the highest possible efficiency is obtained for the amplifier.

The signal Vout is applied to a load R. If the amplifier is used for audio applications, the load R is a resistor modeling the electrical behavior of an audio loudspeaker, for example.

The amplifier according to the invention also has a capacitive circuit Cout, parallel-mounted at the output of the power inverter. The capacitive circuit Cout has at least one first capacitor C11 parallel-connected to the channel of one of the transistors (transistor 131) of the inverter, and preferably, also has a second capacitor C12 parallel-connected to the channel of the other transistor (transistor 132) of the inverter.

In the example shown, since the amplifier is a differential amplifier, capacitors C21 and C22, connected symmetrically to the channel of the transistors 231 and 232, are also provided in the output capacitive circuit. The capacitive circuit Cout has a function of reducing or even eliminating the distortion introduced by the dead time tnr.

The error between the ideal output sine signal and the real output signal at the terminal of the resistor R is the sum of an error introduced by the dead time, and an opposite sine error introduced by the added capacitive circuit and the parasitic capacitive circuit. Ideally, this error should be sinusoidal, which corresponds to a sine signal at the terminals of the load.

It can be shown that, to obtain a sine output signal (i.e., a sine error), it is necessary to have tc>tnr, where tc is the charging time for the output capacitance Ct of the amplifier during the dead phase, and tnr is the dead time.

Since tc=Ct*Vbat/i=Ct*R, where i is the current at the terminals of the load R during the dead phase, it is deduced therefrom that, ideally, the following value is chosen:

$$Ct > tnr/R$$

The output capacitance Ct is the total output capacitance of the inverters, upstream from the filter LC. The output capacitance Ct includes the capacitance of the added capacitive circuit Cout according to the invention, as well as the parasitic capacitance at the terminals of the transistors 131, 132, 231 and 232. Naturally, the parasitic capacitors are all parallel-connected and their capacitance values are added together. This is also the case for the capacitors of the additional capacitive circuit. Moreover, all the capacitance values are taken into account to determine, first of all, the total capacitance necessary to eliminate the distortion, and then the capacitance of the capacitive circuit to be added.

From a practical viewpoint, the choice of the capacitance of the capacitive circuit Cout depends on several criteria.

The numerical values given in the above examples are purely indicative. They correspond approximately to tests made on an audio amplifier capable of amplifying frequency signals between 0 and 24 KHz, with power values in the range of milliwatts, using an LC filter at the output. The capacitor C of the LC filter has a capacitance in the range of 100 pF.

The greater the dead time tnr is, the greater the need for the necessary capacitance of the added capacitive circuit. For example, for parasitic capacitance in the range of 50 pF, the output capacitance Cout should be in the range of 120 pF for tnr in the range of 7 ns, and Cout should be in the range of 20 pF for tnr in the range of 3 ns.

Again, the performance of the amplifier depends on the signal applied to its input. The greater the increase in the frequency of the input signal to be amplified, the greater will be the necessary capacitance of the added capacitive circuit. For example, for a parasitic capacitance of about 50 pF, Cout should be in the range of 100 pF for Fe in the range of 2 KHz, and Cout should be in the range of 110 pF for Fe in the range of 7 KHz.

An added capacitance of about one to two times the value of the capacitance of the parasitic capacitive circuit of the inverters thus provides good results. It is also observed, unfortunately, that the addition of a capacitor at the output of the amplifier has a negative effect on the efficiency of the amplifier. This is due to the fact that the added capacitor modifies the parameters of the LC oscillating circuit forming the output filter. However, this reduction in efficiency, of about 2%, is negligible relative to the gain in quality (in the range of 10 to 20 dB) of the output signal due to the reduction of the distortion of this signal.

That which is claimed is:

1. A digital/analog amplifier comprising:
   a pulse-width modulator for generating a pulse width modulated (PWM) signal;
   a control circuit coupled in series with said pulse-width modulator;
   a power inverter coupled in series with said control circuit and comprising two transistors series-coupled between a power supply terminal and a ground of the amplifier, said two transistors each comprising a channel and being driven by said control circuit based on the PWM signal;
   a capacitive circuit parallel-coupled to an output of said power inverter and comprising a first capacitor parallel-coupled to the channel of one of said two transistors, and a second capacitor parallel-coupled to the channel of the other one of said two transistors; and
   a filter coupled in series with the output of said power inverter and providing an output of the amplifier to be coupled to a load.

2. A digital/analog amplifier according to claim 1, wherein said power inverter comprises a parasitic capacitive circuit, and wherein said capacitive circuit has a capacitance greater than tnr/RCp, where tnr is a dead time of the amplifier, R is a resistance of the load of the amplifier and Cp is a capacitance of the parasitic capacitive circuit.

3. A digital/analog amplifier according to claim 1, wherein said power inverter comprises a parasitic capacitive circuit, and wherein said capacitive circuit has a capacitance greater than tnr/R, where tnr is a dead time of the amplifier, and R is a resistance of the load of the amplifier.

4. A digital/analog amplifier according to claim 2, wherein said capacitive circuit has a capacitance in a range of one to two times the capacitance of the parasitic capacitive circuit.

5. A digital/analog amplifier according to claim 3, wherein said capacitive circuit has a capacitance in a range of one to two times the capacitance of the parasitic capacitive circuit.

6. A differential digital/analog amplifier comprising:
 a pair of arms coupled in parallel, each arm comprising
  a pulse-width modulator for generating a pulse width modulated (PWM) signal,
  a control circuit coupled in series with said modulator,
  a power inverter coupled in series with said control circuit and comprising two transistors series-coupled between a power supply terminal and a voltage reference of the amplifier, said two transistors each comprising a channel and being driven by said control circuit based on the PWM signal, and
  a capacitive circuit parallel-coupled to an output of said power inverter, and comprising a first capacitor parallel-coupled to the channel of one of said two transistors, and a second capacitor parallel-coupled to the channel of the other one of said two transistors; and
 a filter coupled to the output of each power inverter in said pair of arms, and comprising a pair of outputs forming outputs of the amplifier to be coupled to a load.

7. A differential digital/analog amplifier according to claim 6, wherein said power inverter comprises a parasitic capacitive circuit, and wherein said capacitive circuit has a capacitance greater than tnr/RCp, where tnr is a dead time of the amplifier, R is a resistance of the load of the amplifier and Cp is a capacitance of the parasitic capacitive circuit.

8. A differential, digital/analog amplifier according to claim 6, wherein said power inverter comprises a parasitic capacitive circuit, and wherein said capacitive circuit has a capacitance greater than tnr/R, where tnr is a dead time of the amplifier, and R is a resistance of the load of the amplifier.

9. A differential digital/analog amplifier according to claim 7, wherein said capacitive circuit has a capacitance in a range of one to two times the capacitance of the parasitic capacitive circuit.

10. A differential digital/analog amplifier according to claim 8, wherein sad capacitive circuit has a capacitance in a range of one to two times the capacitance of the parasitic capacitive circuit.

11. A method for reducing distortion of a digital/analog amplifier comprising a control circuit in series with a pulse width modulator, and a power inverter in series with the control circuit, the power inverter comprising two transistors series-coupled between a power supply terminal and a voltage reference of the amplifier, the two transistors each comprising a channel and being driven by the control circuit based on the PWM signal, the method comprising:
 coupling in parallel a capacitive circuit to as output of the power inverter, the capacitive circuit comprising a first capacitor parallel-coupled to the channel of one of the two transistors, and a second capacitor parallel-coupled to the channel of the other one of the two transistors.

12. A method according to claim 11 further comprising coupling a filter in series with the output of the power inverter, the filter providing an output of the amplifier to be coupled to a load.

13. A method according to claim 11, wherein the power inverter comprises a parasitic capacitive circuit, and wherein the capacitive circuit has a capacitance greater than tnr/R-Cp, where tnr is a dead time of the amplifier, R is a resistance of the load of the amplifier and Cp is a capacitance of the parasitic capacitive circuit.

14. A method according to claim 11, wherein the power inverter comprises a parasitic capacitive circuit, and wherein the capacitive circuit has a capacitance greater than tnr/R, where tnr is a dead time of the amplifier, and R is a resistance of the load of the amplifier.

15. A method according to claim 13, wherein the capacitive circuit has a capacitance in a range of one to two times the capacitance of the parasitic capacitive circuit.

16. A method according to claim 14, wherein the capacitive circuit has a capacitance in a range of one to two times the capacitance of the parasitic capacitive circuit.

* * * * *

UNITED STATES PATENT AND TRADEMARK OFFICE
CERTIFICATE OF CORRECTION

PATENT NO. : 7,368,986 B2
APPLICATION NO. : 11/321795
DATED : May 6, 2008
INVENTOR(S) : Gael Pillonnet It is certified that error appears in the above-identified patent and that said Letters Patent is hereby corrected as shown below:

Column 6, Line 6        Delete: "sad"
                        Insert: --said--

Column 6, Line 17       Delete: "as"
                        Insert: --an--

Signed and Sealed this

Twenty-third Day of September, 2008

JON W. DUDAS
*Director of the United States Patent and Trademark Office*